(12) United States Patent
Sakaguchi

(10) Patent No.: US 6,459,082 B1
(45) Date of Patent: Oct. 1, 2002

(54) FOCUSED ION BEAM SYSTEM

(75) Inventor: Kiyoshi Sakaguchi, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 09/611,995

(22) Filed: Jul. 7, 2000

(51) Int. Cl.[7] .............................................. H01J 37/08
(52) U.S. Cl. .................................. 250/309; 250/423 R
(58) Field of Search ......................... 250/492.2, 492.1, 250/492.21, 492.23, 492.3, 309, 423 R

(56) References Cited

U.S. PATENT DOCUMENTS 5,111,053 A * 5/1992 Suzuki ........................ 250/424
5,153,440 A * 10/1992 Yasaka ........................ 250/424
5,825,035 A * 10/1998 Mizumura et al. ........... 250/423
5,847,408 A * 12/1998 Kanemaru et al. ............ 257/10
5,969,355 A 10/1999 Fujii et al. ................... 250/309

* cited by examiner

Primary Examiner—Kiet T. Nguyen
(74) Attorney, Agent, or Firm—Webb Ziesenheim Logsdon Orkin & Hanson, P.C.

(57) ABSTRACT

There is disclosed a focused ion beam (FIB) system which has an ion gun equipped with no suppressor electrode but which produces a regulated emission current. The extraction voltage is controlled to regulate the emission current. The FIB system has a control system that controls the extraction voltage as a function of (i) the difference between a measured current and a target current, (ii) the accumulated emission time from the last flashing of an emitter to the present time, and (iii) an accumulated emission pause time during which no emission is performed.

4 Claims, 3 Drawing Sheets

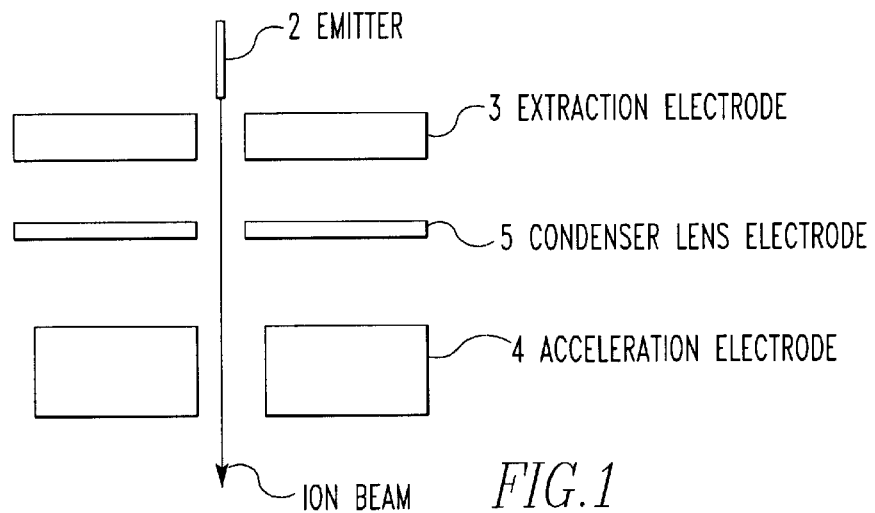
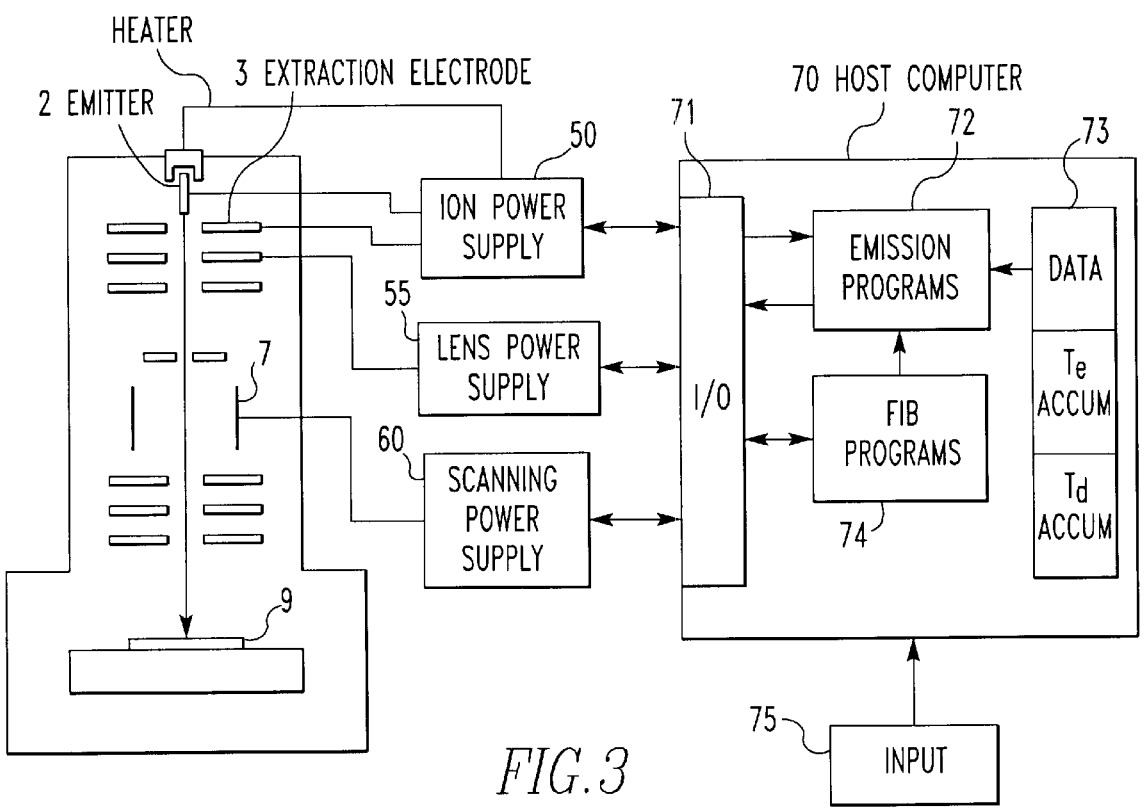

FOCUSED ION BEAM SYSTEM

BACKGROUND OF THE INVENTION

1. Field of the Invention

The present invention relates to a focused ion beam (FIB) system and, more particularly, to extraction of an ion beam from an emitter.

2. Description of the Related Art

FIB (focused ion beam) systems for processing of materials using focused ion beams arising from a metal ion source, such as Ga, and capable of functioning as a scanning ion microscope (for example, a focused ion beam is directed to a material while scanning the beam in two dimensions, secondary ions originating from the material being detected, and an SIM (scanning ion microscope) image being produced) have enjoyed wide acceptance.

One example of the ion optical system of such an FIB system is shown in FIG. 4, where an ion illumination system has a microscope column 1 whose interior is maintained as a high vacuum. An emitter 2 serves as an ion source. An extraction electrode 3 is used to extract an ion beam. An acceleration electrode 4 accelerates the ion beam to a desired energy. A condenser lens electrode 5 cooperates with the extraction electrode 3 and the acceleration electrode 4 in acting as a condenser lens 5a. The condenser lens 5a adjusts the current of the ion beam to a desired current value and is of the electrostatic type. An aperture 6 limits the angular width of the ion beam. Deflection electrodes 7 deflect and scan the ion beam in two dimensions. An objective lens 8 focuses the ion beam onto a specimen 9 to be processed or imaged by scanning ion microscopy. For example, the objective lens 8 is an electrostatic type and made up of three electrodes. The specimen 9 is placed on a specimen stage 10 capable of adjusting the position and the tilt of the specimen. These components and the specimen 9 are placed within a specimen chamber 11. Power supplies (not shown) and a control unit (not shown) are connected with all of the emitter 2, the various electrodes, such as the extraction electrode 3, the various lenses, such as the condenser lens 5a, and the specimen stage 10 to operate them. A detector (not shown) for detecting signals, such as secondary ions, produced from the specimen 9, a processing circuit (not shown) for processing the output signal from the detector, a display device (not shown) for displaying SIM images, and other devices are connected with the control unit and power supplies.

When the material or specimen 9 is processed with the ion beam or an SIM image is generated by this FIB system, it is desired that the smallest possible diameter of the ion beam be obtained and that the ion beam current be sufficiently stable. Therefore, in a general FIB system, a suppressor electrode S is added between the emitter 2 and the extraction electrode 3 as shown in FIG. 5 to regulate the emission current from the emitter 2. The insertion of the suppressor electrode S has many advantages other than its capability to easily regulate the emission current or the ion beam current. For example, the extraction voltage can be maintained constant. In addition, if a voltage applied to the suppressor electrode S is varied for regulation, the ion beam is hardly affected. That is, the hit position, the beam diameter, and other factors associated with the ion beam are hardly affected.

The addition of this suppressor electrode S inevitably increases the extraction voltage. For instance, where extraction is achieved at 4 to 5 kV, if the suppressor electrode S is added, the extraction voltage is increased to about 9 to 12 kV. Where the extraction voltage is increased in this way, the beam diameter is undesirably increased as shown in FIG. 6.

In recent years, specimen feature sizes have become smaller and smaller. Therefore, the need for finer ion beams has become more urgent. Accordingly, it has been considered to omit the suppressor electrode S. If so, the emission current is regulated by the voltage applied to the extraction electrode 3. In particular, the voltage applied to the extraction electrode 3 is so controlled that the difference between the presently measured current and the target current becomes null.

However, experiment has shown that this method has the following disadvantage. If the amount of feedback is not appropriate, the control cannot be provided with good response or oscillation takes place. To avoid such a phenomenon, the emitter should be maintained in a constant state. For this purpose, a flashing operation is frequently performed by temporarily energizing a heater mounted close to the emitter to heat the emitter, thereby removing contaminants from the surface of the emitter. In this way, the emitter is refreshed at all times. However, frequent flashing lowers the throughput of the instrument and shortens the life of the emitter.

SUMMARY OF THE INVENTION

It is an object of the present invention to provide an FIB system capable of producing finer ion beams and sufficiently stable emissions.

A first embodiment of the present invention provides a focused ion beam (FIB) system having an emitter acting as an ion beam source, an extraction electrode for extracting an ion beam from the emitter, an acceleration electrode for imparting energy to the extracted ion beam, at least one lens for focusing the ion beam, and a specimen stage on which a specimen to be irradiated with the focused ion beam is placed. The FIB system is characterized by controlling emission current. The emission current is controlled by adjusting the voltage applied to the extraction electrode. The voltage applied to the extraction electrode is set as a function of the target emission current, the currently measured emission current, and the accumulated emission time from the last flashing.

A second embodiment of the present invention provides a focused ion beam (FIB) system that also has an emitter acting as an ion beam source, an extraction electrode for extracting an ion beam from the emitter, an acceleration electrode for imparting energy to the extracted ion beam, at least one lens for focusing the ion beam, and a specimen stage on which a specimen to be irradiated with the focused ion beam is placed. The FIB system is characterized by controlling emission current substantially as described for the first embodiment. The voltage applied to the extraction electrode is set as a function of target emission current, currently measured emission current, accumulated emission pause time from the last flashing, and accumulated halt time since the last flashing.

A third embodiment of the present invention provides an FIB system which is based on the first or second embodiment described above and further characterized in that a flag is used to inhibit change of the voltage applied to the extraction electrode described above.

A fourth embodiment of the present invention provides an FIB system which is based on any one of the first, second, or third embodiments described above and is further characterized in that the voltage applied to the extraction electrode described above is controlled by computer software.

Other objects and features of the invention will appear in the course of the description thereof, which follows.

BRIEF DESCRIPTION OF THE DRAWINGS

FIG. 1 is a schematic diagram of an emitter and its vicinities mounted in a focused ion beam (FIB) system in accordance with the present invention, and in which the emission current is regulated by controlling the extraction voltage;

FIG. 3 is a schematic diagram of an FIB system, in accordance with the present invention;

DESCRIPTION OF THE PREFERRED EMBODIMENTS

The basic theory of the present invention and its preferred embodiments are hereinafter described in detail with reference to the accompanying drawings.

Figure 2A:
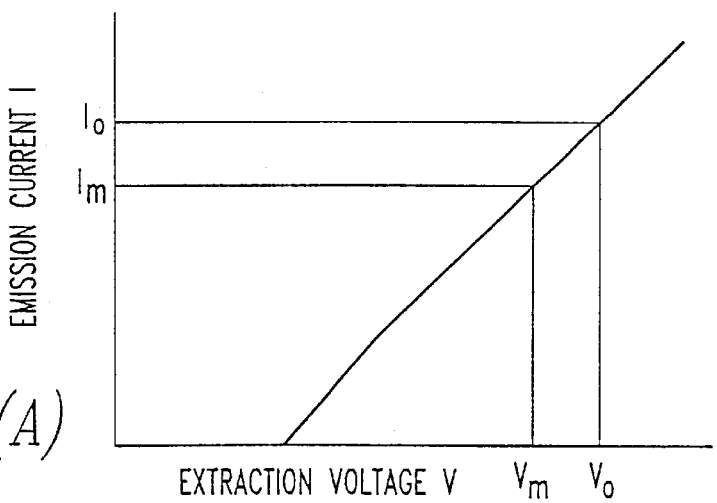
FIGS. 2(A)–2(C) are graphs illustrating the fundamental theory of the present invention for regulating the emission current by controlling the extraction voltage.
Figure 2B:
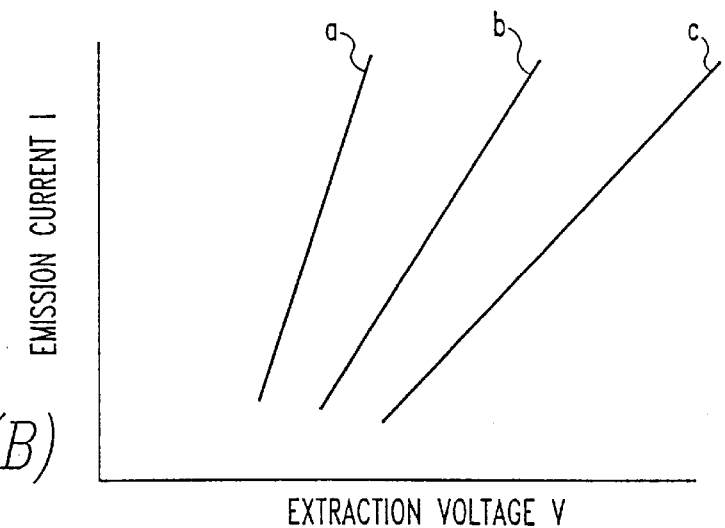
Figure 2C:
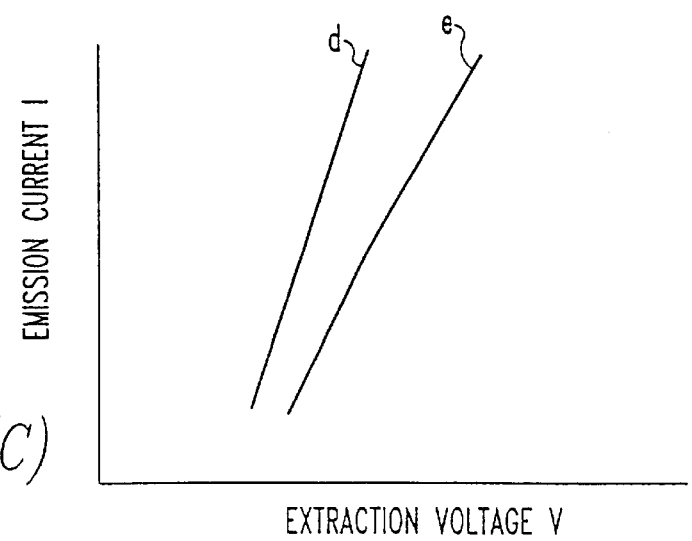

Referring to FIG. 1, there are shown an emitter for generating an ion beam and its vicinity (hereinafter referred to as the ion beam-generating portion) when the emission current is controlled by an extraction voltage. This ion beam-generating portion has no suppressor electrode. FIG. 2(A) is a graph illustrating the principle of a method for controlling the emission current by the extraction voltage using the ion beam-generating portion constructed as shown in FIG. 1. FIG. 2(B) is a graph illustrating the relation of the emission current I to the extraction voltage V of the structure shown in FIG. 1 for three different elapsed times. FIG. 2(C) is a graph illustrating the relation of the emission current I to the extraction voltage V of the structure shown in FIG. 1 for two different cases.

In FIG. 2(A), plotted on the horizontal axis is the extraction voltage V, and plotted on the vertical axis is the emission current I. It is assumed that the measured emission current I is $I_m$, though the emission current I is set to $I_0$. At an extraction voltage $V_0$, the emission current I should be $I_0$. Let $V_m$ be the present extraction voltage. If the difference between $V_0$ and $V_m$, or $\Delta V = V_0 - V_m$, is added to the present extraction voltage $V_m$, then the emission current I should be set to $I_0$. This is the basic theory of the method of controlling the emission current I by the extraction voltage V. In practice, however, the response is poor or oscillation takes place with undesirable results. The main cause of this is described below.

FIG. 2(B) shows the results of one experiment in which the suppressor electrode S is omitted and the emission current is controlled by the extraction voltage. The extraction voltage V is plotted on the horizontal axis, while the emission current I is plotted on the vertical axis. Line a indicates the relation obtained shortly after the start of an emission. Line b indicates the relation obtained after some time since the start of the emission. Line c indicates the relation obtained when time has elapsed further and flashing should be performed soon. It can be seen from this graph that the gradient and position of the line varies, depending on the elapsed time since the start of an emission. As a result, if the relation a adapted for the case in which a long time has not yet passed since the start of an emission is used for the control in the later cases b and c as described above, the response of the control becomes poorer. Conversely, if the relation adapted for the case c is used, oscillation takes place in the earlier cases b and a. One conceivable compromise between these two methods consists of using only the line a and performing flashing. frequently. This will inevitably deteriorate the throughput of the instrument and shorten the life of the emitter.

Accordingly, it can be seen that the elapsed time from the start of an emission should be reflected in the graph of FIG. 2(A). That is, where the relation a of FIG. 2(B) adapted for a short period since the start of an emission is taken as a basis, the gradient of the graph of FIG. 2(A) should be made milder with time after the start of an emission.

FIG. 2(C) shows the result of another experiment in which the suppressor electrode S is omitted and the emission current is controlled by the extraction voltage. Again, the extraction voltage V is plotted on the horizontal axis, while the emission current I is plotted on the vertical axis. Line d indicates a case in which only a short time has elapsed since the start of an emission, and is identical with line a of FIG. 2(B). Line e indicates a case in which an emission is started after a long pause, and only a short time has elapsed since the start of the emission. Specifically, in the case of FIG. 2(B), the progress of the emission presents a problem. In the case of FIG. 2(C), however, if the pause (during which no emission is effected) is long, the duration of this pause poses a problem in spite of no emission. Of course, the progress of the pause is less influential than the progress of the emission.

In order to control the extraction voltage V appropriately while taking account of these factors, parameters that determine lines a, b, c of FIG. 2(B) and line e of FIG. 2(C) must be known. These parameters vary subtly, depending on the instrumental design and on the detailed profile of the emitter. Accordingly, line a of FIG. 2(B) is first obtained from an actual instrument. For example, it is approximated by a quadratic curve. With respect to the lines b, c, e, if measured values of these lines are obtained, these values are used. If no measured values are available, they are approximated by quadratic curves using estimated values. The instrument is then operated. The deviations of the found control values from the results are recorded. In this way, data are accumulated. The values of the parameters are updated at suitable times.

Where the suppressor electrode S is omitted and the emission current is controlled with the extraction voltage as described above, it is necessary to control the emitter by taking account of the elapsed time from the start of an emission. Results that are more satisfactory will be obtained if the pause time since the cease of the emission is also taken into account. In this way, the emission current is successfully regulated.

Under this condition, however, the omission of the suppressor electrode S will affect the hit position of the ion beam as well as the beam diameter. In particular, when the extraction voltage V is controlled, i.e., is varied, the beam position is slightly moved at the same time. This problem is caused by quite slight asymmetry of the geometry and arrangement of the emitter and its surroundings. Unfortunately, a perfect solution is not found.

Accordingly, we adopt the following solution. A flag for inhibiting control of the emission current is contained in computer software. For example, when a sequence of processing operations is being conducted, control of the emission current is inhibited. One example of the sequence of processing operations consists of a complete operation for processing one part of the specimen 9, i.e., from start to end of the processing. Another example consists of a full operation for scanning the ion beam for one frame to obtain one SIM image. Usually, the duration of such a sequence of operations is on the order of seconds to about ten minutes. The longest duration is tens of minutes.

Figure 4:
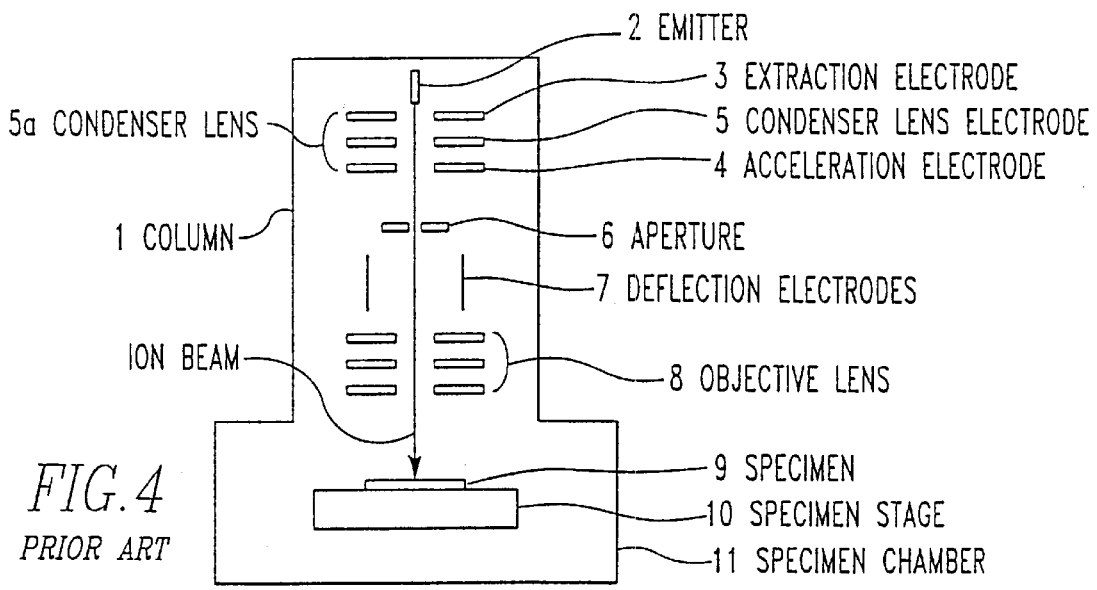
FIG. 4 is a schematic diagram of a conventional FIB system.
Figure 5:
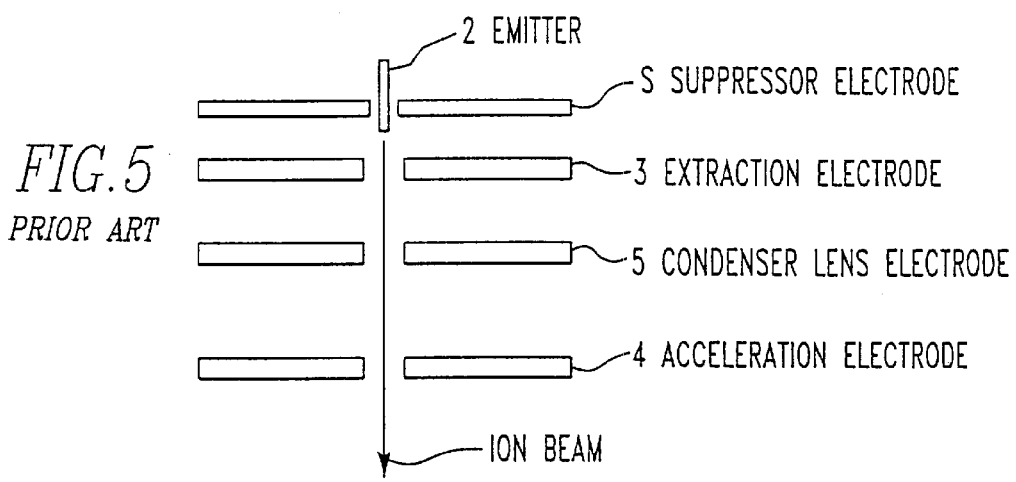
FIG. 5 is a diagram of an emitter and its vicinity mounted in the conventional FIB system shown in FIG. 4.
Figure 6:
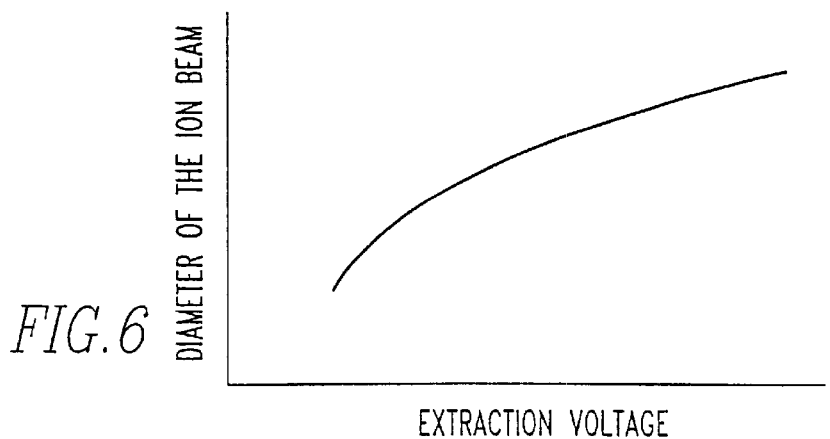
FIG. 6 is a graph illustrating the relation of the ion beam diameter to the extraction voltage used in the FIB system shown in FIGS. 3 and 4.

A specific example of this instrument is next described in detail. FIG. 3 is a block diagram of an FIB system in accordance with the present invention, the system being equipped with the ion beam-generating portion shown in FIG. 1. The system shown in FIG. 3 has an emitter 2, an extraction electrode 3, and deflection electrodes 7 similar to the system already described in connection with FIG. 4. A specimen 9 is also placed in the same way as in the system of FIG. 4. The system of FIG. 3 further includes an ion generating-and-controlling power supply/control portion 50 for generating and controlling an ion beam, a lens power supply/control portion 55 for condenser lens electrode 5, and a scanning power supply/control portion 60 for scanning the ion beam across the specimen 9. A host computer 70 is ancillary to the FIB system. An I/O interface 71 connects the ion generating-and-controlling power supply/control portion 50 and the scanning power supply/control portion 60 with the host computer 70. A program 72 for regulating the emission current is loaded in the host computer 70. The host computer 70 has a control data file 73 that holds data (described later). Various FIB programs 74 used for the FIB system are loaded in the host computer 70. A parameter input device 75, such as a keyboard, is connected with the host computer 70.

The control data file 73 holds various kinds of data including a flag F for inhibiting control, a sampling interval $t_f$ for setting of the flag F, a set emission current value $I_0$, an accumulated emission time $T_e$, an accumulated emission pause time $T_b$, an interval time $t_i$ at which the extraction voltage is set and controlled, a function $\Delta V = f(\Delta I, T_e, T_b)$ used to calculate a change in the extraction voltage from the difference between the measured emission current value $I_m$ and the set emission current value $I_0$ (i.e., $\Delta I = _m - I_0$) the accumulated emission time $T_e$, and the accumulated emission pause time $T_b$, and a tolerance $\epsilon$ for the setting. To update the aforementioned parameters, the measured emission current value after a change of the extraction voltage can be preferably recorded together with other data. Based on the results of various experiments, the flag F is set at sampling intervals $t_f$ of about 10 seconds. The extraction voltage is controlled at intervals $t_i$ of about 15 minutes.

The operation of the instrument constructed in this way is as follows. At first, when the emitter 2 is flashed, the accumulated emission time $T_e$ and the accumulated emission pause time $T_b$ are cleared. If a human operator operates the parameter input device 75 to activate one of the FIB programs 74, the emission current regulation program 72 is activated according to an instruction from the FIB program 74. Concomitantly, the ion generating-and-controlling power supply/control portion 50 is operated via the I/O interface 71. An accelerating voltage is applied to the emitter 2, and an extraction voltage is applied to the extraction electrode 3. The instant at which this application is made is sent to the control data file 73, and the accumulated emission time $T_e$ is started to be accumulated. The accumulated emission pause time $T_b$, however, is not started to be accumulated yet. The results are recorded. The FIB program 74 controls the ion generating-and-controlling power supply/control portion 50 to increase the extraction voltage gradually for achieving a desired emission current. The value of the desired emission current (set emission current value $I_0$) is stored in the control data file 73 via the emission current regulation program 72.

After setting the emission current to the desired value, the emission current regulation program 72 checks at intervals of $t_i$ (e.g., every 15 minutes) (i.e., at extraction voltage control intervals) that the control inhibit flag F is not set. The ion generating-and-controlling power supply/control portion 50 measures the emission current value $I_m$. If the flag F is set, no operation is performed until the next time of extraction voltage control. This measured emission current value $I_m$ is compared with the set emission current value $I_0$ stored in the control data file 73. If the difference is less than the tolerance $\epsilon$, then no operation is performed until the next time of extraction voltage control. If the difference is in excess of the tolerance $\epsilon$, then the function $\Delta V = f(\Delta I, T_e, T_b)$ having the difference $\Delta I = I_m - I_0$, the accumulated emission time $T_e$ stored in the control data file 73, and the accumulated emission pause time $T_b$ as variables is calculated. Based on the results, the emission current regulation program 72 instructs the ion generating-and-controlling power supply/control portion 50 via the I/O interface 71 to add $\Delta V$ to the present extraction voltage. In response to this, the ion generating-and-controlling power supply/control portion 50 changes the voltage applied to the extraction electrode 3. To accumulate data obtained by actual measurements for updating of the parameters described above, the emission current value $I_m$ is again measured after the completion of the aforementioned control operation. The measured value, or results of the control, is stored in the control data file 73, along with other data.

Simultaneously with the operations described above, the emission current regulation program 72 interrogates the lens power supply/control portion 55, the scanning power supply/control portion 60, and other components via the I/O interface 71 at sampling intervals $t_f$ as to whether the sequence of operation is in progress. If it is in progress, the control inhibit flag F is set. If not so, the flag is cleared.

When the human operator operates the parameter input device 75 to quit emitting the ion emission, the accumulation of the accumulated emission pause time $T_b$ is started and the accumulation of the accumulated emission time $T_e$ is stopped.

The accumulated emission time $T_e$ and the accumulated emission pause time $T_b$ are cleared when the emitter 2 is flashed next time.

In the embodiment described above, if the control inhibit flag F is set, no operation is performed until the next time of extraction voltage control. Sometimes, however, the following problems might occur.

In a first case, the control inhibit flag F happens to be set consecutively when control of the extraction voltage is tried, though the sequence of operations is short. To avoid this situation, if the extraction voltage is not controlled because the flag F is set, then the extraction voltage is started to be controlled immediately after the flag F is subsequently cleared.

In a second case, the sequence of operations itself is long and so the control inhibit flag F is kept set. The extraction voltage is not controlled. As a result, the emission current varies to values exceeding the tolerated value. In this case, a second tolerance $\delta$ that is greater than the first-mentioned tolerance $\epsilon$ by an appropriate value is programmed into the instrument. Irrespective of the setting of the flag F, the emission current value $I_m$ is measured. The difference between the measured emission current value $I_m$ and the set emission current value $I_0$, i.e., $\Delta I = I_m - I_0$, is compared with the second tolerance δ. If the difference ΔI is in excess of the second tolerance δ, then a warning is given to the operator. Alternatively, the sequence of operations is suspended, and the emission current is reset or controlled. Then, the remaining part of the sequence of operations is performed.

As described thus far, in the present invention, the suppressor electrode S is omitted. When the emission current is controlled by the extraction voltage, the change ΔV in the extraction voltage is found as a function of the difference between the measured emission current value and the set emission current value, i.e., $\Delta I = I_m - I_0$, the accumulated emission time $T_e$, and the accumulated emission pause time $T_b$. Consequently, the extraction voltage can be lowered to 5 to 7 kV; where the suppressor electrode S is mounted, the extraction voltage is 9 to 12 kV. Hence, the resolution can be improved. Furthermore, use of the control inhibits flag F prevents variations in the beam position, which would normally be caused when the extraction voltage is modified.

In addition, the frequency of flashing operations can be reduced by the appropriate regulation of the emission current as described above. This can contribute to improvement of the throughput of the instrument. Furthermore, the life of the emitter can be prolonged.

Having thus described my invention with the detail and particularity required by the Patent Laws, what is desired protected by Letters Patent is set forth in the following claims.

What is claimed is:

1. In a focused ion beam system having an emitter acting as an ion beam source, an extraction electrode for extracting an ion beam from the emitter, an acceleration electrode for imparting energy to the extracted ion beam, at least one lens for focusing the ion beam, means for flashing the emitter by heating the emitter to increase the temperature for a period of time to remove contaminates from the emitter, and a specimen stage on which a specimen to be irradiated with the focused ion beam is placed, the improvement comprising means for accumulating emission time from the last flashing, and control means for determining a voltage applied to the extraction electrode and regulating emission current from the emitter, said control means determining the voltage to be applied to the extraction electrode at intermittent times and continuously applying a voltage to the extraction electrode, the voltage applied to the extraction electrode being set as a function of a target emission current to be achieved, a currently measured emission current, and an accumulated emission time from the last flashing.

2. In a focused ion beam system having an emitter acting as an ion beam source, an extraction electrode for extracting an ion beam from the emitter, an acceleration electrode for imparting energy to the extracted ion beam, at least one lens for focusing the ion beam, means for flashing the emitter by heating the emitter to increase the temperature for a period of time to remove contaminates from the emitter, and a specimen stage on which a specimen to be irradiated with the focused ion beam is placed, the improvement comprising means for accumulating emission time from the last flashing and means for accumulating emission pause time from the last flashing, and control means for determining a voltage applied to the extraction electrode, and regulating emission current from the emitter, said control means determining the voltage to be applied to the extraction electrode at intermittent times and continuously applying a voltage to the extraction electrode, the voltage applied to the extraction electrode being set as a function of a target emission current to be achieved, a currently measured emission current, an accumulated emission time from the last flashing, and an accumulated emission pause time from the last flashing.

3. In the focused ion beam system of claim 1 or 2, the further improvement wherein a flag for inhibiting change of the voltage applied to said extraction voltage is used.

4. In the focused ion beam system of claim 1 or 2, the further improvement wherein the voltage applied to said extraction electrode is controlled by a computer software program.

* * * * *